(12) United States Patent
Ge et al.

(10) Patent No.: US 9,837,147 B2
(45) Date of Patent: Dec. 5, 2017

(54) REGULATING MEMRISTOR SWITCHING PULSES

(71) Applicant: Hewlett Packard Enterprise Development LP, Houston, TX (US)

(72) Inventors: Ning Ge, Palo Alto, CA (US); Jianhua Yang, Palo Alto, CA (US); Adam L. Ghozeil, Corvallis, OR (US); Brent Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/307,486

(22) PCT Filed: Apr. 30, 2014

(86) PCT No.: PCT/US2014/036222
§ 371 (c)(1),
(2) Date: Oct. 28, 2016

(87) PCT Pub. No.: WO2015/167551
PCT Pub. Date: Nov. 5, 2015

(65) Prior Publication Data
US 2017/0062048 A1    Mar. 2, 2017

(51) Int. Cl.
*G11C 13/00* (2006.01)
*G11C 27/02* (2006.01)

(52) U.S. Cl.
CPC ...... *G11C 13/0038* (2013.01); *G11C 13/0002* (2013.01); *G11C 13/0007* (2013.01);
(Continued)

(58) Field of Classification Search
CPC ............ G11C 13/0038; G11C 13/0002; G11C 13/0007; G11C 13/0067; G11C 13/0069;
(Continued)

(56) References Cited

U.S. PATENT DOCUMENTS 8,300,444 B2    10/2012    Nagashima et al.
8,416,604 B2    4/2013    Kim et al.
(Continued)

OTHER PUBLICATIONS

International Searching Authority, The International Search Report and the Written Opinion, PCT/US2014/036222, dated Jan. 19, 2015, 11 Pages.
(Continued)

*Primary Examiner* — Ly D Pham
(74) *Attorney, Agent, or Firm* — Fabian VanCott

(57) ABSTRACT

A device for regulating memristor switching pulses is described. The device includes a voltage source to supply a voltage to a memristor. The device also includes a voltage detector to detect a memristor voltage. The memristor voltage is based on an initial resistance state of the memristor and the voltage supplied by the voltage source. The device also includes a comparator to compare the memristor voltage with a target voltage value for the memristor. The device also includes a feedback loop to indicate to a control switch when the memristor voltage is at least equal to the target voltage value. The device also includes a control switch to cut off the memristor from the voltage source when the memristor voltage is at least equal to the target voltage value.

15 Claims, 7 Drawing Sheets

(52) U.S. Cl.
CPC ...... *G11C 13/0064* (2013.01); *G11C 13/0069* (2013.01); *G11C 13/004* (2013.01); *G11C 27/024* (2013.01); *G11C 2013/0054* (2013.01); *G11C 2013/0066* (2013.01); *G11C 2013/0076* (2013.01); *G11C 2013/0092* (2013.01)

(58) Field of Classification Search
CPC .......... G11C 27/024; G11C 2013/0066; G11C 2013/0076; G11C 2013/0092
USPC ........................................ 365/189.07, 189.16
See application file for complete search history.

(56) References Cited

U.S. PATENT DOCUMENTS

| | | | |
|---|---|---|---|
| 8,593,853 | B2 | 11/2013 | Katoh |
| 2008/0180990 | A1 | 7/2008 | Lung |
| 2010/0085794 | A1 | 4/2010 | Chen et al. |
| 2011/0235403 | A1 | 9/2011 | Kang |
| 2012/0011092 | A1 | 1/2012 | Tang et al. |
| 2012/0014169 | A1* | 1/2012 | Snider .................. G11O 5/141 365/148 |
| 2012/0092182 | A1 | 4/2012 | Daniel et al. |
| 2012/0096234 | A1* | 4/2012 | Jiang .................. G11C 11/5678 711/170 |
| 2012/0230081 | A1 | 9/2012 | Close et al. |
| 2013/0070534 | A1* | 3/2013 | Carter ...................... G11C 7/12 365/189.05 |
| 2013/0343114 | A1 | 12/2013 | Carter |
| 2014/0211536 | A1* | 7/2014 | Ordentlich ......... G11C 13/0007 365/148 |
| 2014/0215121 | A1* | 7/2014 | Ordentlich .......... G06F 12/0246 711/102 |
| 2015/0008988 | A1* | 1/2015 | Zidan ...................... H03B 7/00 331/115 |
| 2015/0187414 | A1* | 7/2015 | Perner .................. G11C 13/004 365/148 |
| 2015/0347896 | A1* | 12/2015 | Roy ........................ G11C 11/16 365/148 |

OTHER PUBLICATIONS

Zidan, M.A. et al., Memristor-based Memory: the Sneak Paths Problem and Solutions, Feb. 2013, 9 Pgs., vol. 44, No. 3.

* cited by examiner

REGULATING MEMRISTOR SWITCHING PULSES

BACKGROUND

A memristor may be used to store or process information. Information may be stored or processed by a memristor by switching a resistance state of the memristor. A voltage source may switch the resistance state of a memristor by supplying the memristor with a voltage.

BRIEF DESCRIPTION OF THE DRAWINGS

The accompanying drawings illustrate various examples of the principles described herein and are a part of the specification. The illustrated examples do not limit the scope of the claims.

Throughout the drawings, identical reference numbers designate similar, but not necessarily identical, elements.

DETAILED DESCRIPTION

Figure 1:
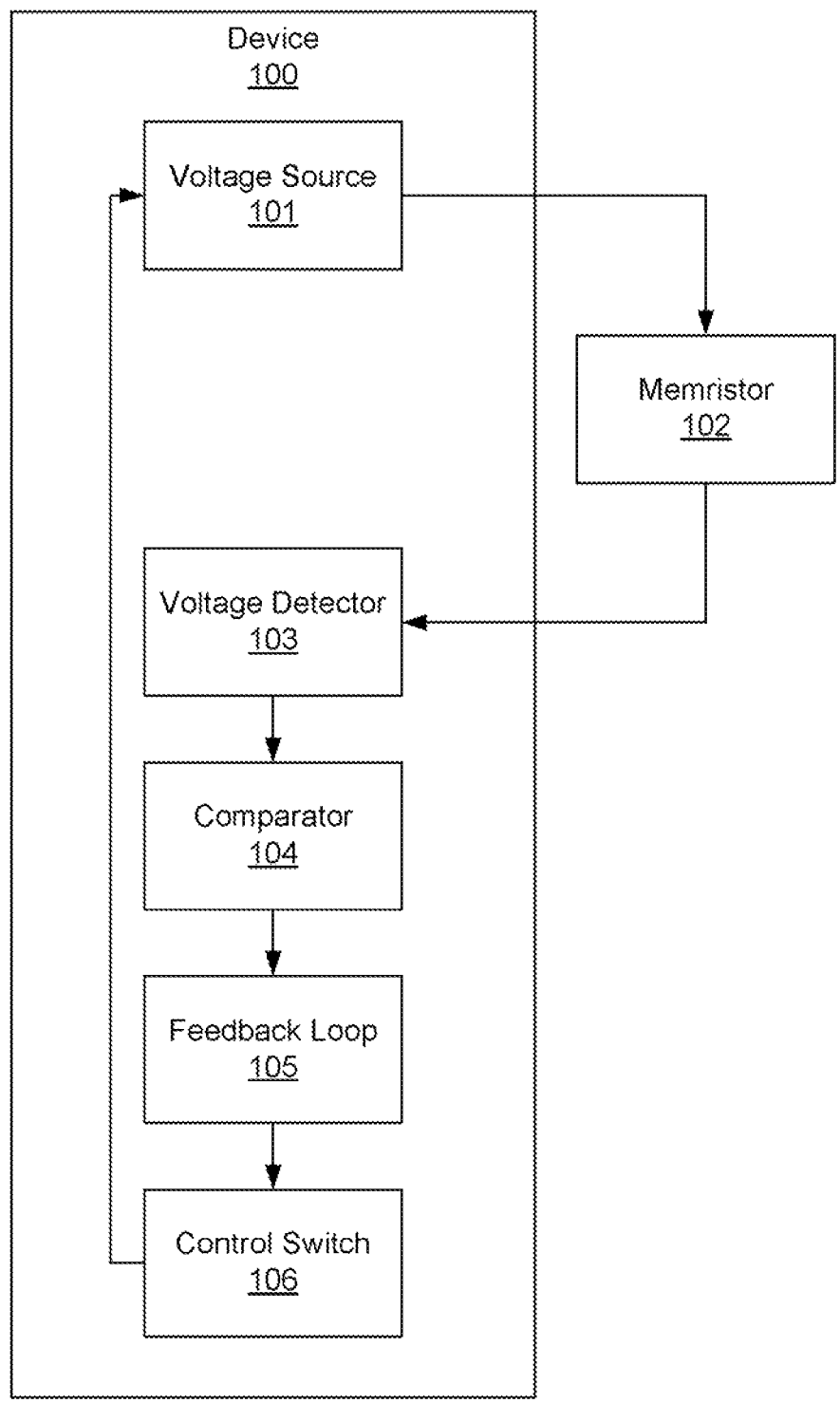
FIG. 1 is a diagram of a device for regulating memristor switching pulses according to one example of the principles described herein.

Memory devices may be used to store information relating to a computing device. For example, a memory device may be set to a value, such as 1 or 0 to effectively store data in a memory device. In one example, a memristor may be used as a memory device to store information. Data is effectively stored to a memristor device based on a resistance value. For example, distinct resistance values of a memristor may be assigned a value such as 1 or 0. Data is written to the memristor by placing the memristor in a resistance "state" that corresponds to a 1 or a 0.

Memristors may be classified as either cation memristors or anion memristors based on the nature of the mobile species of the switching material. For example, anion memristors include oxide insulators, such as transition metal oxides, complex oxides and large band gap dielectrics, and some other non-oxide materials. By comparison, cation based memristors include electrochemically active electrodes such as gold or copper.

Both types of memristors operate on the principle that an oxide, in one form, behaves as a nominal insulator. A switching event then occurs in which the oxide undergoes an abrupt switching event to transition into a conductive form. Therefore the resistance of the memristor device is switched between a high resistance state (HRS) and a low resistance state (LRS). The high resistance state and the low resistance state may be used to represent digital states of 0 and, 1 respectively.

Switching the memristor device may include passing a voltage to the memristor device to move the memristor device between resistance states. For example, during a memory write operation, a voltage pulse sent from a voltage source may move a memristor device from a "high resistance state" to a "low resistance state." While the use of memristors as memory devices may be beneficial, certain characteristics of memristors impede their effective use as memory devices.

For example, despite manufacturing controls and other control operations, memristors may exhibit different initial resistance values. These variations may indicate that a memristor may achieve a desired voltage value quicker or slower than other memristors. For example, the duration of a switching voltage pulse to put a memristor in a "low resistance state" may vary among memristors. However, in operation, a standard switching pulse may be sent to all memristors. Accordingly, some memristors that have a higher initial resistance may not use as long a pulse as the standard and may lead to an inefficient use of that particular memristor.

Still further, the variations in memristor initial resistances may also lead to over-stressed memristors. For example, a larger voltage may be used to change a memristor from its initial resistance value, referred to as its "virgin state," than is used for subsequent changes of the memristor resistance state. This larger voltage may be referred to as a forming voltage. If the forming voltage is too high, or the pulse associated with the forming voltage is too long, subsequent switches may be difficult, or may be performed with increased current levels.

Accordingly, the present disclosure describes a system and method for regulating memristor switching pulses. More specifically, the present disclosure describes a circuit to generate a voltage pulse that is customized based on a number of memristor characteristics such as an initial resistance value of the memristor device being tested.

The present disclosure describes a device for regulating memristor switching pulses. The device includes a voltage source to supply a voltage to a memristor. The device also includes a voltage detector to detect a memristor voltage. The memristor voltage is based on the initial resistance state of the memristor and the voltage supplied by the voltage source. The device further includes a comparator to compare the memristor voltage with a target voltage value for the memristor. The device further includes a feedback loop to indicate to a control switch when the memristor voltage is at least equal to the target voltage value. The device further includes a control switch for cutting off the memristor from the voltage source when the memristor voltage is at least equal to the target voltage value.

The present disclosure describes a method for regulating memristor switching pulses. The method includes detecting, via a voltage detector, a memristor voltage. The memristor voltage is based on a voltage supplied by a voltage source and an initial resistance of the memristor. The method also includes comparing, via a comparator, the memristor voltage with a target voltage value for the memristor. The method may further include cutting off, via a control switch, the memristor from the voltage source based on the target voltage value for the memristor.

The present disclosure describes a computer program product for regulating memristor switching pulses. The computer program product includes a computer readable storage medium comprising computer usable program code embodied therewith. The computer usable program code includes computer usable program code to, when executed by a processor, receive a target voltage value for a memristor. The target voltage value regulates a switching pulse for the memristor. The computer usable program code includes computer usable program code to, when executed by a processor, direct a voltage source to supply a voltage to the memristor and monitor a switching cycle of a memristor based on the target voltage value and a memristor voltage.

A device to regulate memristor switching pulses as described in the present disclosure may be beneficial in that it provides for customized switching pulses based on the specific initial conditions of a particular memristor device, which may help to reduce the propensity of post-switching resistance variation.

As used in the present specification and in the appended claims, the term "memristor" may refer to a passive two-terminal circuit element that maintains a functional relationship between the time integral of current and the time integral of voltage.

Further, as used in the present specification and in the appended claims, the term "memristor voltage" may refer to a voltage experienced by a particular memristor. The memristor voltage may be different from the voltage supplied by the voltage source. The memristor voltage is unique to each memristor and is based on the voltage supplied by the voltage source and the initial resistance of the memristor. For example, as different memristors have different initial resistance values, the different memristors may have a different memristor voltage as a function of time.

Still further, as used in the present specification and in the appended claims, the term "device" may refer to a combination of physical components that may regulate memristor switching pulses. For example, the device may refer to combination of circuit elements, circuitry, or combinations thereof that regulate memristor switching pulses. In some examples, the device may be included in a testing circuit, or as part of a write circuit.

Still further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Turning now to the figures, FIG. 1 is a diagram of a device (100) for regulating memristor switching pulses according to one example of the principles described herein. The device (100) may include a voltage source (101) that supplies a voltage to a memristor (102). For example, as described above, a memristor (102) may be a circuit element that may switch resistance states based on a received voltage. The state of the memristor (102) may determine what information is stored therein. In some examples, the voltage supplied by the voltage source (101) may be a voltage pulse having a value and a duration. For example, the voltage source (101) may supply one volt for a period of nine nanoseconds. In this example, the one volt is the pulse value and the nine nanoseconds is the pulse duration.

In some examples, the length of the voltage pulse used to switch a memristor (102) varies depending on the particular memristor (102). For example, a first memristor (102) that has a higher initial resistance switches slower than a second memristor (102) that has a lower initial resistance. In other words, the first memristor (102) switches resistance state with a voltage pulse that is shorter in duration. Accordingly, the device (100) includes a voltage detector (103) that detects the voltage present in the memristor (102). The voltage present in the memristor (102), or the memristor (102) voltage, is based on the voltage supplied by the voltage source (101) as well as the initial resistance of the memristor (102). In other words the memristor (102) voltage may be different from the voltage provided by the voltage source (101) based on the initial resistance of the memristor (102). As will be described below, the voltage detector (103) may be a capacitor that detects the memristor (102) voltage.

The device (100) also includes a comparator (104) that compares the memristor (102) voltage with a target voltage value for the memristor (102). In some examples, the target voltage value may be a value that indicates that a memristor has completed a switch cycle. As used in the present specification and in the appended claims, a switch cycle may refer to a cycle wherein a memristor (102) moves from a high resistance state to a low resistance state. For example, the target voltage value may indicate a pulse value and pulse duration that may move a memristor (102) from a high resistance state to a low resistance state. As will be described in more detail below the target voltage value may be set based on the voltage source (101). In another example, the target voltage value may be set based on a voltage divider associated with the voltage source (101). In yet another example, the target voltage value may allow a user to establish a desired target voltage value for the memristor (102).

The comparator (104) compares the memristor (102) voltage with the target voltage value and may output a signal indicating that the memristor voltage (102) is at least equal to the target voltage value. In some examples, the comparator (104) may output the actual memristor voltage (102), when it is at least equal to the target voltage value. In another example, the comparator (104) may output a signal that indicates that the memristor (102) voltage and the target voltage value are at least equal to one another. For example, if the memristor (102) voltage is at least equal to the target voltage value, the comparator (104) may output a first signal. By comparison, if the target voltage value is greater than the memristor (102) voltage, the comparator (104) may output a second signal that is distinct from the first signal, or may not output a signal at all.

The device (100) may also include a feedback loop (105) that may include a number of circuit elements that feed the output of the comparator (104) to a control switch (106). In some examples, the feedback loop (105) may simply be a circuit that relays a voltage value to the control switch (106). For example, when the memristor (102) voltage is at least equal to the target voltage value, the comparator (104) may output the memristor (102) voltage. In other examples, the comparator (104) may output a signal, distinct from the voltage, which indicates that the memristor (102) voltage is at least equal to the target voltage value.

In some examples, the feedback loop (105) may include a decoder to translate the comparator (104) output into a form usable by the control switch (106). For example, if the comparator (104) outputs a signal, or a voltage, the feedback loop (105) may convert the output into a control signal to adjust the control switch (106). In some examples, the feedback loop (105) may include circuitry that controls the control switch (106). For example, as will be described below, the control switch (106) may operate to disconnect the voltage source (101) from the memristor (102). In this example, the feedback loop (106) may include circuitry to carry out the disconnection.

The device (100) may also include a control switch (106) to electrically couple the voltage source (101) with the memristor (102). For example, when the control switch (106) is closed, the voltage source (101) may pass a voltage to the memristor (102). By comparison, when the control switch (106) is open, the voltage source (101) does not pass a voltage to the memristor (102). In some examples, the control switch (106) may be opened based on the output of the comparator (104). For example, when the memristor (102) voltage is at least equal to the target voltage value, the control switch (106) may open to disconnect the voltage source (101) from the memristor (102). In some examples, the device (100) includes additional components to close the control switch (106), for example, after a memristor (102) has switched from a high resistance state to a low resistance state.

As depicted in FIG. 1, in some examples, the device (100) is selectively coupled to the memristor (102). For example, the device (100) may be a tester in which a memristor (102) is placed for testing purposes. In this example, the memristor (102) may be removed and placed on another circuit for use. In another example, the memristor (102) is attached to the device (100). For example, the device (100), with the accompanying memristor (102), may be part of a write circuit on an integrated circuit.

The device (100) as described herein may be beneficial in that it allows customizable pulse modulation based on the individual characteristics of a particular memristor (102). For example, as different memristors (102) have different initial resistance values, the memristor (102) voltage at any given time may be different. Accordingly, the length of time to reach the target voltage value, i.e., the time to complete a switch from a high resistance state to a low resistance state, may vary. In other words, the device (100) may allow for a switching voltage to be cut off based on when a particular memristor (102), with a unique initial resistance value, reaches a target voltage; rather than being cut off from the voltage source (101) based on a standard pulse length common among multiple memristors (102).

Moreover, such modulation may be performed without significant interaction by a user as the device (100) includes circuitry to detect a voltage of the memristor (102) and to disconnect the voltage source (101) from the memristor (102) when a particular voltage value is reached.

Figure 2:
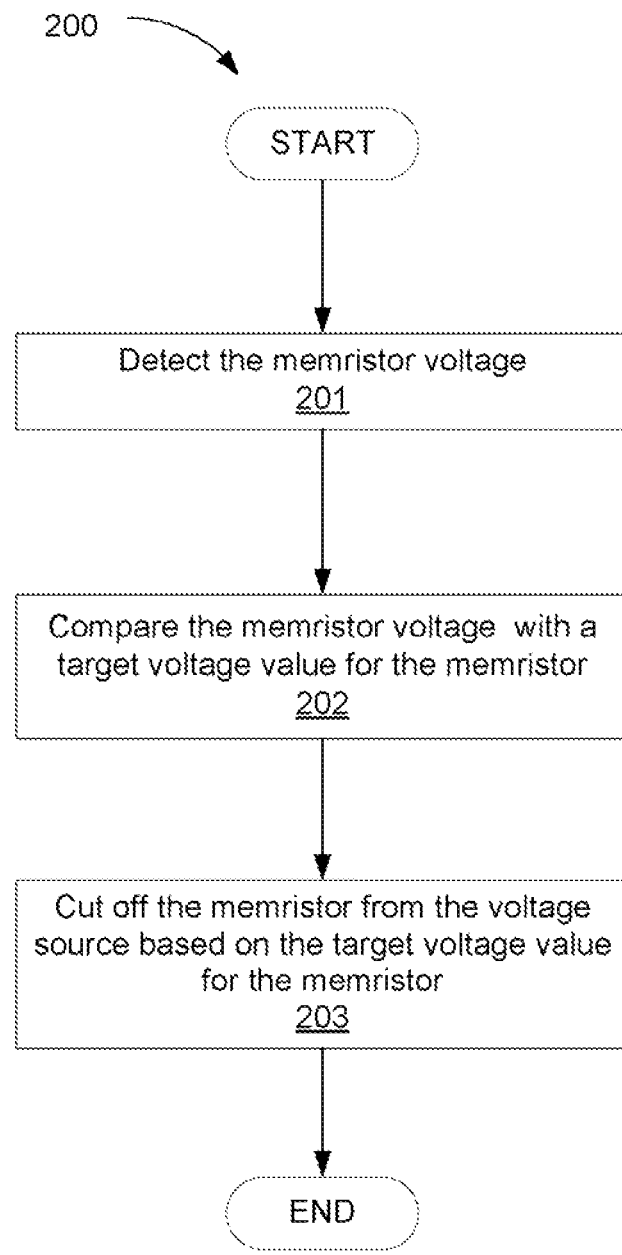
FIG. 2 is a flowchart of a method for regulating memristor switching pulses according to one example of the principles described herein.

FIG. 2 is a flowchart of a method (200) for regulating memristor (FIG. 1, 102) switching pulses according to one example of the principles described herein. The method includes detecting (block 201) a memristor (FIG. 1, 102) voltage. The memristor (FIG. 1, 102) voltage is based on the voltage supplied by the voltage source (FIG. 1, 101) and an initial resistance of the memristor (FIG. 1, 102). As described above, a voltage source (FIG. 1, 101) may supply a voltage pulse, which may be defined by a pulse value and a pulse duration, to switch a memristor (FIG. 1, 102) from a high resistance state to a low resistance state. The characteristics of the memristor (FIG. 1, 102) voltage may be based, at least in part, on the initial conditions of the memristor (FIG. 1, 102). For example, a memristor (FIG. 1, 102) with a higher initial resistance may use a longer voltage pulse to switch the memristor (FIG. 1, 102) as compared to another memristor (FIG. 1, 102) that may have a lower initial resistance. Accordingly, a voltage detector (FIG. 1, 103) may detect (block 201) the memristor (FIG. 1, 102) voltage.

The method (200) may also include comparing (block 202) the memristor (FIG. 1, 102) voltage with a target voltage value for the memristor (FIG. 1, 102). The target voltage value may be a voltage value that indicates that the memristor (FIG. 1, 102) has completed a switch cycle from one resistance state to another resistance state. The target voltage value may be based on the voltage source, a voltage source and a voltage divider, or a received input of a desired target voltage value. Allowing input of a desired target voltage value may be beneficial in that it allows for customization of a write cycle for a particular memristor (FIG. 1, 102).

Comparing (block 202) the memristor (FIG. 1, 102) voltage with a target voltage value for the memristor (FIG. 1, 102) may include outputting an indication when the memristor (FIG. 1, 102) voltage is at least equal to the target voltage value. For example, if the memristor (FIG. 1, 102) voltage is less than the target voltage value, the comparator (FIG. 1, 104) may output a signal so indicating. In some examples, if the memristor (FIG. 1, 102) voltage is less than the target voltage value, the comparator (FIG. 1, 104) may not output a signal. By comparison, if the memristor (FIG. 1, 102) voltage is at least equal to the target voltage value, the comparator (FIG. 1, 104) may output a signal so indicating. In some examples, the output is the voltage value associated with the larger of the target voltage and the memristor (FIG. 1, 102) voltage. For example, the comparator (FIG. 1, 104) may output a signal when the memristor (FIG. 1, 102) voltage is greater than the target voltage value. In some examples, the comparator (FIG. 1, 104) outputs a signal when the memristor (FIG. 1, 102) voltage is at least equal to the target voltage value and refrains from outputting any signal when the target voltage value is greater than the memristor (FIG. 1, 102) voltage.

In some examples, the comparison of the memristor (FIG. 1, 102) voltage and the target voltage value may be in, or near, real-time. For example, for a period of time when the target voltage value is greater than the memristor (FIG. 1, 102) voltage, the comparator may refrain from outputting any signal. Then, as the memristor (FIG. 1, 102) voltage surpasses the target voltage value, the comparator (FIG. 1, 104) outputs a signal so indicating.

The method (200) may also include cutting off (block 203) the memristor (FIG. 1, 102) from the voltage source based on the target voltage value for the memristor (FIG. 1, 102). For example, while the comparator (FIG. 1, 104) indicates that the target voltage value is greater than the memristor (FIG. 1, 102) voltage, the memristor (FIG. 1, 102) is in continuous communication with the voltage source (FIG. 1, 101). Then, once the memristor (FIG. 1, 102) voltage is at least equal to the target voltage value, as indicated by the comparator (FIG. 1, 104), the memristor (FIG. 1, 102) is cut-off from the voltage source (FIG. 1, 101). In some examples, the memristor (FIG. 1, 102) is cut-off (block 203) from the voltage source (FIG. 1, 101) when the memristor (FIG. 1, 102) voltage is greater than the target voltage value. In other examples, the memristor (FIG. 1, 102) is cut-off (block 203) from the voltage source (FIG. 1, 101) when the memristor (FIG. 1, 102) voltage is at least equal to the target voltage value.

The method (200) as described herein may be beneficial in that it allows for customizable and self-modulated memristor (FIG. 1, 102) switching pulses. Such customization and self-modulation simplifies memristor (FIG. 1, 102) use and reduces the effects of memristor (FIG. 1, 102) variations.

Figure 3:
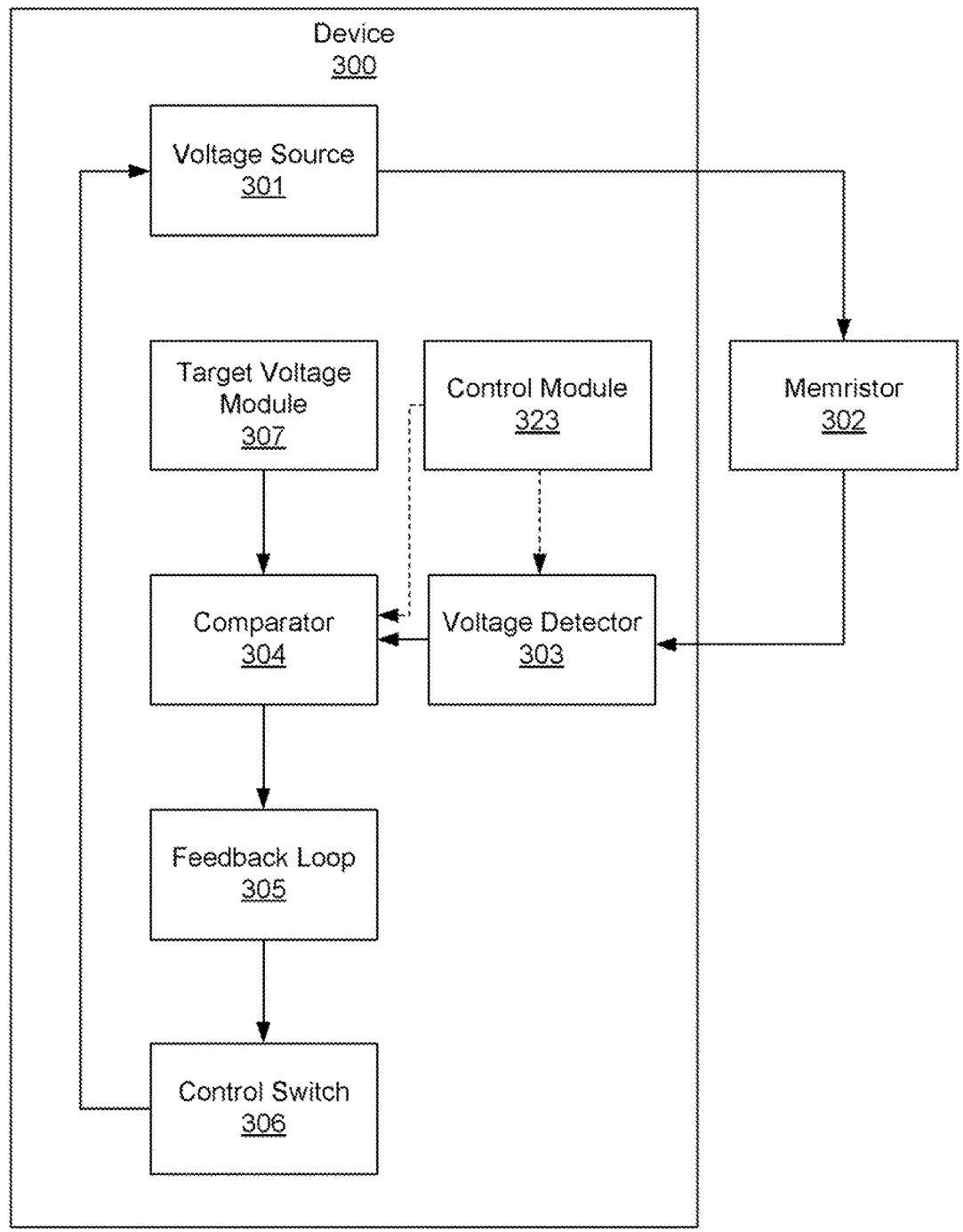
FIG. 3 is another diagram of a device for regulating memristor switching pulses according to one example of the principles described herein.

FIG. 3 is another diagram of a device (300) for regulating memristor (302) switching pulses according to one example of the principles described herein. In some examples, the device (300) may include a target voltage module (307) that establishes the target voltage value for the memristor (302). In some examples, the target voltage module (307) may establish as the target voltage value a fixed voltage as supplied by the voltage source (301).

In another example, the target voltage module (307) may include a voltage divider that establishes as the target voltage value a modified version of the voltage supplied by the voltage source (301). For example, the voltage divider might reduce the supplied voltage by some amount.

In yet another example, the regulating device (300) may allow for a received input to be selected as the target voltage value. Accordingly, the target voltage module (307) that establishes the target voltage value for the memristor (302) may allow a received input to be selected as the target voltage value. For example, a user may select a specific target voltage value based on knowledge of a memristor (302) batch, environmental considerations, as well as other factors that may lead to a selection of a target voltage value. Allowing for received input of a target voltage value may be beneficial in that it may allow for fine-tuning of the switching pulse based on the different characteristics of different memristors (302).

As demonstrated above in regards to FIG. 1, the voltage detector (303), comparator (304), feedback loop (305), and control switch (306) may then operate to cut-off the memristor (302) from the voltage source (301) based on the memristor (302) voltage and the target voltage value established by the target value set module (307).

The device (300) may also include a control module (323). The control module (323) may detect a malfunctioning memristor (302). For example, the control module (323) may detect when a memristor (302) failed to switch. In some examples, the control module (323) may detect a malfunctioning memristor (302) by detecting that an output of the comparator (304) has not indicated that the memristor (302) voltage is at least equal to the target voltage value. In another example, the control module (323) detects that the target voltage value has not been reached within a determined period of time. In another example, the control module (323) may detect a malfunctioning memristor (302) via the voltage detector (303).

The control module (323) may provide feedback regarding a malfunctioning memristor (302). For example, the control module (323) may continue to monitor the memristor (302) for subsequent failures. In another example, the control module (323) may mark the memristor (302) as faulty.

While FIG. 3 depicts the control module (323) as part of the device (300), in some examples, the control module (323) may be external to the device (300). In this example, the device (300) may output a signal by which the control module (323) may detect a malfunctioning memristor (302) and may provide feedback accordingly.

Figure 4:
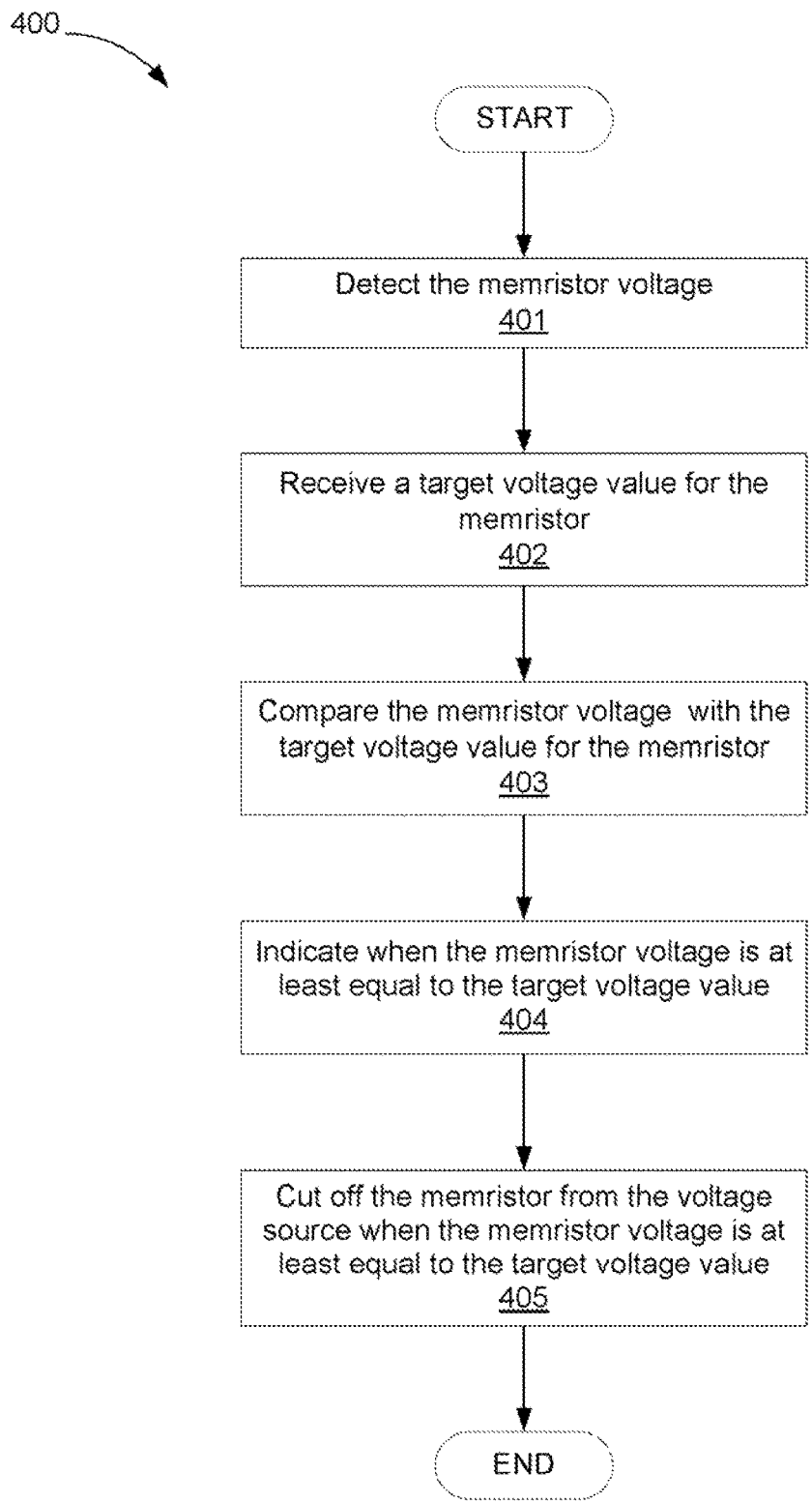
FIG. 4 is another flowchart of a method for regulating memristor switching pulses according to one example of the principles described herein.

FIG. 4 is another flowchart of a method (400) for regulating memristor (FIG. 1, 102) switching pulses according to one example of the principles described herein. The method (400) may include detecting (block 401) a memristor (FIG. 1, 102) voltage. In some examples, this may be done as described in connection with FIG. 2.

The method (400) may include receiving (block 402) a target voltage value for the memristor (FIG. 1, 102). For example, the target voltage module (FIG. 3, 307) may set a target voltage value based on a voltage pulse from the voltage source (FIG. 1, 101), the voltage source (FIG. 1, 101) and a voltage divider, or a received input indicating a target voltage value.

The method (400) may include comparing (block 403) the memristor (FIG. 1, 102) voltage with a target voltage value for the memristor (FIG. 1, 102). In some examples, this is done as described in connection with FIG. 2.

The method (400) may include indicating (block 404) when the memristor (FIG. 1, 102) voltage is greater than or equal to the target voltage value. For example, the comparator (FIG. 1, 104) may output a signal indicating that the memristor (FIG. 1, 102) voltage is at least equal to the target voltage value. In another example, the comparator (FIG. 1, 104) may output the actual memristor (FIG. 1, 102) voltage when the memristor (FIG. 1, 102) voltage is at least equal to the target voltage value.

The method (400) may also include cutting-off (block 405) the memristor (FIG. 1, 102) from the voltage source (FIG. 1, 101) when the memristor (FIG. 1, 102) voltage is at least equal to the target voltage value. This may be done as described in connection with FIG. 2. This may include opening a control switch (FIG. 1, 106) that connects the voltage source (FIG. 1, 101) and the memristor (FIG. 1, 102).

Figure 5:
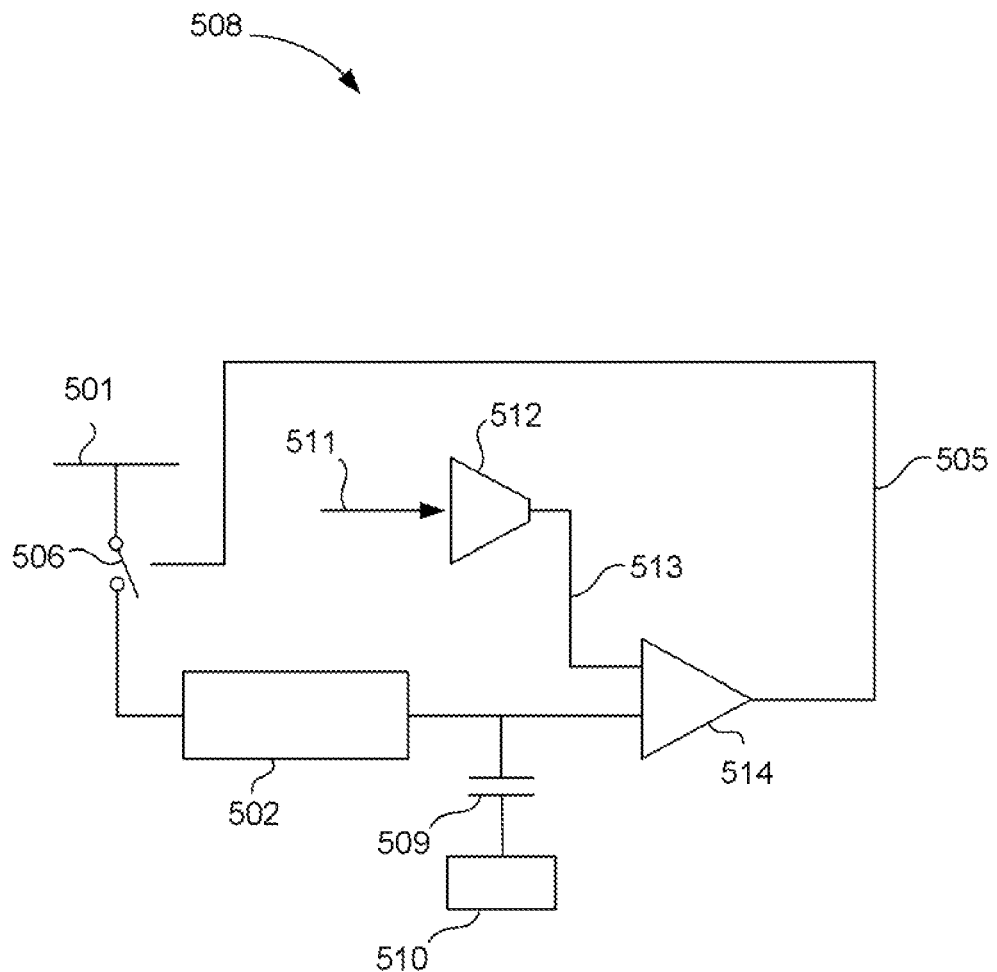
FIG. 5 is a diagram of a circuit for regulating memristor switching pulses according to one example of the principles described herein.

FIG. 5 is a diagram of a circuit (508) for regulating memristor (502) switching pulses according to one example of the principles described herein. As described above, in some examples, the circuit (508) is used in context of a tester prior to the memristor (502) being used by a computing device. In this example, the memristor (502) may be removably coupled to the circuit (508). In other examples, the circuit (508) is used in a computing device, for example, as a write circuit. In this example, the memristor (502) may be integrally formed with the circuit (508). While FIG. 5 depicts a single memristor (502), the circuit (508) may be implemented to facilitate a number of memristors (502). In other words, the circuit (508) may include multiplexing circuitry to simultaneously test a number of memristors (502).

In use, a voltage source (501) may supply a voltage pulse to the memristor (502). The voltage pulse may have a pulse value and a pulse duration. When the control switch (506) is closed, the voltage may be passed to the memristor (502). A capacitor (509) in series with the memristor (502) may detect the memristor (502) voltage. For example, the capacitor may determine the memristor (502) voltage based on Formula 1:

$$V = \frac{Q}{C} = \frac{\int_0^t I}{C}. \qquad \text{(Formula 1)}$$

In formula 1, "V" may be the memristor (502) voltage, "I" may be the current passing through the memristor (502), and "C" may be the capacitance of the capacitor (509). The current passing through the memristor (502) may be determined based on the initial resistance of the memristor (502). For example, the larger the initial memristor (502) resistance, the smaller the current and the longer pulse used to switch the memristor (502). The memristor (502) voltage may reflect the voltage supplied by the voltage source (501)

as adjusted based on the initial resistance of the memristor (502). The capacitor (509) may be coupled to ground (510). In some examples, the circuit (508) may further include a discharge transistor to remove the charge from the capacitor (509) once the memristor (502) has switched and after the control switch (506) has been opened.

As described above, the device (FIG. 1, 100) may include a comparator (FIG. 1, 104) to compare the memristor (502) voltage with a target voltage value (513). Accordingly, the circuit (508) may include a comparator (FIG. 1, 104) such as an operational amplifier (514) to compare the memristor (502) voltage with the target voltage value (513). The comparator (FIG. 1, 104) may compare the two voltages and output a signal indicating when the memristor (502) voltage is at least equal to the target voltage value (513). The operational amplifier (514) may include two analog inputs, and a single binary digital output.

Similarly, as described above, the circuit (508) may include a target value module (FIG. 3, 307) that establishes a target voltage value (513) for the memristor (502). In this example, the target voltage module (FIG. 3, 307) may be a digital-to-analog converter (512) that receives a digital input (511). The digital input (511) may be a value set by a user to be the target voltage value (513). In some examples, the established target voltage value (513) may be based on a number of characteristics of the memristor (502).

As described above, the comparator (FIG. 1, 104) may output a signal indicating that the memristor (502) voltage is at least equal to the target voltage value (513). This output is relayed to the control switch (506) via the feedback loop (505). When a signal is received indicating that the memristor (502) voltage is at least equal to the target voltage value (513), the control switch (506) opens, disconnecting the memristor (502) from the voltage source (501).

Figure 6:
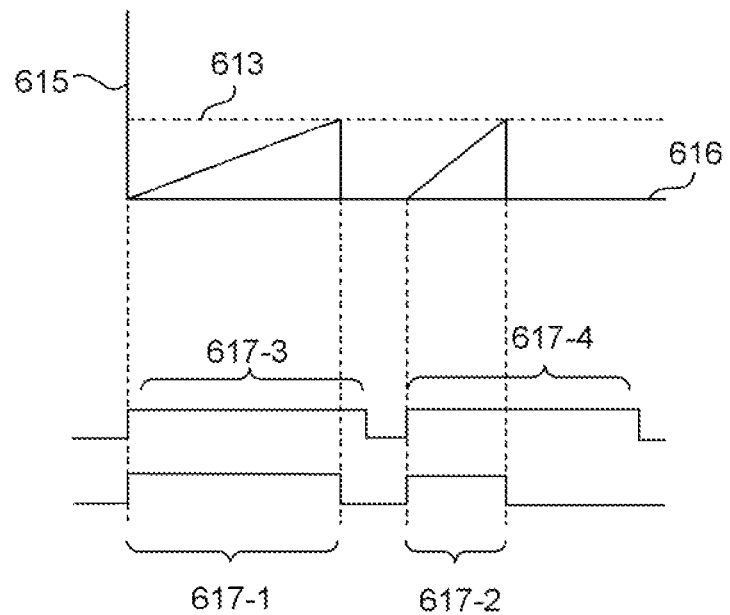
FIG. 6 depicts examples of different memristor switching pulses according to one example of the principles described herein.

FIG. 6 depicts examples of different memristor switching pulses (617) according to one example of the principles described herein. Specifically, FIG. 6 presents a graph which depicts a memristor (FIG. 1, 102) voltage as indicated on the y-axis (615) relative to time on the x-axis (616).

FIG. 6 depicts examples of modulated switching pulses (617-1, 617-2) for two different memristors (FIG. 1, 102). As demonstrated above, based on initial resistance values of a memristor (FIG. 1, 102), the time it takes the memristor (FIG. 1, 102) voltage to reach a target voltage value (613), at which time the control switch (FIG. 1, 106) removes the memristor (FIG. 1, 102) from the voltage source (FIG. 1, 101), may vary depending on the memristor (FIG. 1, 102). For example, as depicted in FIG. 6, a first memristor (FIG. 1, 102) may be a memristor (FIG. 1, 102) with a high initial resistance state. Accordingly, it might take longer for the memristor (FIG. 1, 102) voltage to reach the target voltage value (613) as compared to a second memristor (FIG. 1, 102) that may be a low initial resistance memristor (FIG. 1, 102). This time difference is indicated in FIG. 6, by the first modulated pulse (617-1) that has a longer pulse width and the second modulated pulse (617-2) that has a shorter pulse width.

FIG. 6 also depicts a pair of standard voltage pulses (617-3, 617-4) as compared to the modified voltage pulses (617-1, 617-2). As illustrated in FIG. 6, the device (FIG. 1, 101) and the circuit (FIG. 5, 508) described in the present specification may allow for modified voltage pulses (617-1, 617-2) that are 1) shorter than a standard voltage pulses (617-3, 617-4) and 2) customizable based on the characteristics of the individual memristors (FIG. 1, 102).

Figure 7:
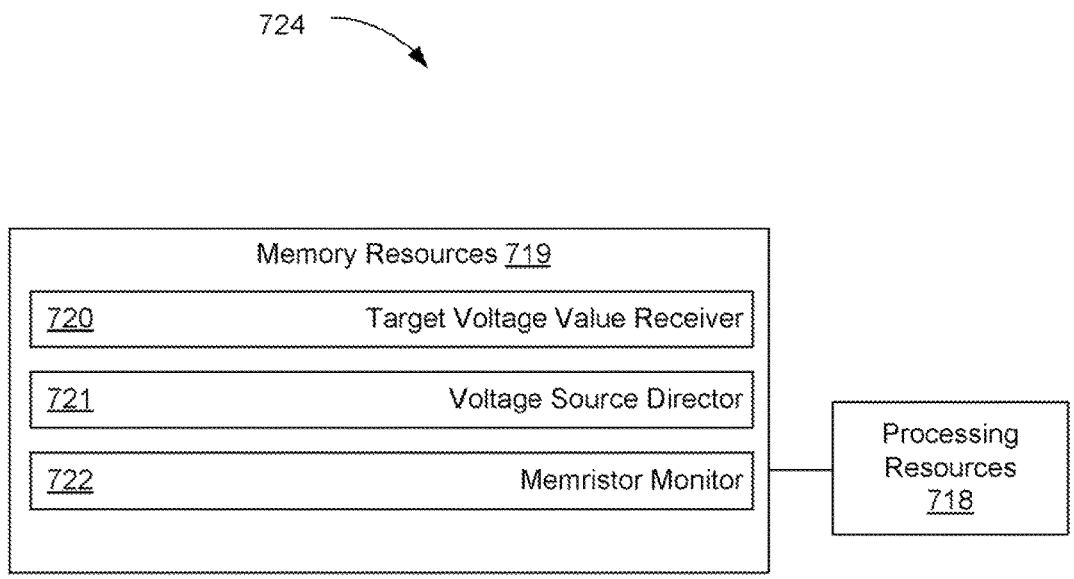
FIG. 7 is a diagram of a device for regulating memristor switching pulses according to one example of the principles described herein.

FIG. 7 is a diagram of a controller (724) for regulating memristor (FIG. 1, 102) switching pulses (FIG. 6, 617) according to one example of the principles described herein. In this example, the controller (724) includes processing resources (718) that are in communication with memory resources (719). Processing resources (718) include at least one processor and other resources used to process programmed instructions. The processor may include the hardware architecture to retrieve executable code from the controller (724) and execute the executable code. The executable code may, when executed by the processing resources (718), cause the processing resources (718) to implement at least the functionality of regulating memristor (FIG. 1, 102) switching pulses (FIG. 6, 617), according to the methods of the present specification described herein. In the course of executing code, the processing resources (718) may receive input from and provide output to a number of the remaining hardware units. In some examples, the controller (724) may be part of the device (FIG. 1, 100) used to test the memristor (FIG. 1, 102), or part of a write circuit of which the memristor (FIG. 1, 102) is included. The controller may be controlled by computer executable code, an application specific integrated circuit (ASIC), or combinations thereof.

The memory resources (719) represent generally any memory capable of storing data such as programmed instructions or data structures used by the regulating device (700). The memory resources (719) may store data such as executable program code that is executed by the processing resources (718) or other processing device. As will be discussed, the controller (724) may specifically store a number of applications that the processing resources (718) execute to implement at least the functionality described herein.

The programmed instructions shown stored in the memory resources (719) include a target voltage value receiver (720), a voltage source director (721), and a memristor monitor (722).

The memory resources (719) include a computer readable storage medium that contains computer readable program code to cause tasks to be executed by the processing resources (718). The computer readable storage medium may be tangible and/or physical storage medium. The computer readable storage medium may be any appropriate storage medium that is not a transmission storage medium. A non-exhaustive list of computer readable storage medium types includes non-volatile memory, volatile memory, random access memory, write only memory, flash memory, electrically erasable program read only memory, or types of memory, or combinations thereof.

The target voltage value receiver (720) represents programmed instructions that, when executed, cause the processing resources (718) to receive a target voltage value (FIG. 5, 513) for a memristor (FIG. 1, 102). The target voltage value (FIG. 5, 513) is used to regulate a switching pulse for the memristor (FIG. 1, 102). The target voltage value receiver (720) may be implemented by the target voltage module (FIG. 3, 307). The voltage source director (721) represents programmed instructions that, when executed, cause the processing resources (718) to direct the voltage source (FIG. 1, 101) to supply a voltage to the memristor (FIG. 1, 102). The memristor monitor (722) represents programmed instructions that, when executed, cause the processing resources (718) to monitor a switching cycle of a memristor (FIG. 1, 102) based on the target voltage value (FIG. 5, 513) and a memristor (FIG. 1, 102) voltage. Monitoring a switching cycle may include determining whether a memristor (FIG. 1, 102) switches resistance states within a period of time and providing feedback when the memristor (FIG. 1, 102) fails to switch resistance states during the period of time. Providing feedback may include monitoring the memristor (FIG. 1, 102), or marking the memristor (FIG. 1, 102) as a failed memristor. The memristor monitor (722) may be implemented by the control module (FIG. 3, 323).

The memory resources (719) may be part of an installation package. In response to installing the installation package, the programmed instructions of the memory resources (719) may be downloaded from the installation package's source, such as a portable medium, a server, a remote network location, another location, or combinations thereof. Portable memory media that are compatible with the principles described herein include DVDs, CDs, flash memory, portable disks, magnetic disks, optical disks, other forms of portable memory, or combinations thereof. In other examples, the program instructions are already installed. Here, the memory resources can include integrated memory such as a hard drive, a solid state hard drive, or the like.

In some examples, the processing resources (718) and the memory resources (719) are located within the same physical component, such as a server, or a network component. The memory resources (719) may be part of the physical component's main memory, caches, registers, non-volatile memory, or elsewhere in the physical component's memory hierarchy. Alternatively, the memory resources (719) may be in communication with the processing resources (718) over a network. Further, the data structures, such as the libraries, may be accessed from a remote location over a network connection while the programmed instructions are located locally. Thus, the regulating device (700) may be implemented on a user device, on a server, on a collection of servers, or combinations thereof.

The controller (724) of FIG. 7 may be part of a general purpose computer. However, in alternative examples, the regulating device (700) is part of an application specific integrated circuit.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor resources (718) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

A device and method for regulating memristor switching pulses may have a number of advantages, including: (1) reducing the effects of variations between memristors; (2) automatically cutting-off a memristor when a target value is reached; (3) reduce memristor stress imposed by a standard voltage pulse; and (4) allow for customization of switching criteria.

The preceding description has been presented to illustrate and describe examples of the principles described. This description is not intended to be exhaustive or to limit these principles to any precise form disclosed. Many modifications and variations are possible in light of the above teaching.

What is claimed is:

1. A device for regulating memristor switching pulses, the device comprising:
   a voltage source to supply a voltage to a memristor;
   a voltage detector to detect a memristor voltage, in which the memristor voltage is based on an initial resistance state of the memristor and the voltage supplied by the voltage source;
   a comparator to compare the memristor voltage with a target voltage value for the memristor, the target voltage value used to regulate a switching pulse for the memristor;
   a feedback loop to indicate to a control switch when the memristor voltage is at least equal to the target voltage value; and
   a control switch to automatically cut off and disconnect the memristor from the voltage source when the memristor voltage is at least equal to the target voltage value.

2. The device of claim 1, further comprising a target voltage module to establish the target voltage value for the memristor.

3. The device of claim 2, in which the target voltage module comprises a digital-to-analog converter (DAC).

4. The device of claim 2, in which the target voltage value is established based on a number of characteristics of the memristor.

5. The device of claim 1, further comprising a control module, in which the control module:
   detects when a memristor is malfunctioning based on the target voltage value; and
   provides feedback regarding a malfunctioning memristor.

6. The device of claim 2, in which the target voltage value indicates that the memristor has completed a switch cycle.

7. The device of claim 1, in which the voltage detector comprises a capacitor.

8. A method for regulating memristor switching pulses, the method comprising:
   detecting, via a voltage detector, a memristor voltage, in which the memristor voltage is based on a voltage supplied by a voltage source and an initial resistance of the memristor;
   comparing, via a comparator, a memristor voltage with a target voltage value for the memristor, the target voltage value used to regulate a switching pulse for the memristor; and
   automatically cutting off and disconnecting, via a control switch, the memristor from the voltage source based on the target voltage value.

9. The method of claim 8, in which the memristor is cut off from the voltage source when the memristor voltage is at least equal to the target voltage value.

10. The method of claim 8, further comprising receiving, via a target voltage module, the target voltage value for the memristor.

11. The method of claim 8, further comprising, indicating when the memristor voltage is at least equal to the target voltage value for the memristor.

12. The method of claim 11, in which indicating when a memristor voltage is at least equal to the target voltage value for the memristor comprises outputting the memristor voltage.

13. The method of claim 8, in which the voltage detector comprises a capacitor, in which the capacitor is positioned after the memristor in a circuit.

14. A computer program product for regulating memristor switching pulses, the computer program product comprising:
- a non-transitory computer readable storage medium comprising computer usable program code embodied therewith, the computer usable program code comprising:
    - computer usable program code to, when executed by a processor, receive a target voltage value for a memristor, in which the target voltage value is used to regulate a switching pulse for the memristor;
    - computer usable program code to, when executed by a processor, direct a voltage source to supply a voltage to the memristor;
    - computer usable program code to, when executed by a processor, monitor a switching cycle of a memristor based on the target voltage value and a memristor voltage; and
    - computer usable program code to, when executed by a processor, automatically cut off and disconnect the memristor from the voltage source based on the target voltage value.

15. The computer program product of claim 14, in which computer usable program code to monitor a switching cycle of a memristor comprises computer usable program code, to, when executed by a processor:
- determine whether the memristor switches resistance state during a period of time; and
- provide feedback when the memristor fails to switch resistance states during the period of time.

* * * * *